United States Patent
Deschermeier et al.

(10) Patent No.: US 7,932,628 B2
(45) Date of Patent: Apr. 26, 2011

(54) CONTROL DEVICE WITH TERMINAL 15—HOLDING CIRCUIT

(75) Inventors: Georg Deschermeier, Hohenschambach (DE); Rainer Kagerbauer, Regensburg (DE); Dirk Reichow, Wenzenbach (DE)

(73) Assignee: Siemens VDO Automotive AG, Munich (DE)

( * ) Notice: Subject to any disclaimer, the term of this patent is extended or adjusted under 35 U.S.C. 154(b) by 591 days.

(21) Appl. No.: 11/863,327

(22) Filed: Sep. 28, 2007

(65) Prior Publication Data

US 2008/0238511 A1    Oct. 2, 2008

(30) Foreign Application Priority Data

Sep. 28, 2006    (DE) .......................... 10 2006 046 032

(51) Int. Cl.
*B60L 1/00*    (2006.01)
(52) U.S. Cl. ........... 307/10.6; 307/10.7; 361/90; 361/92
(58) Field of Classification Search ................. 307/10.6, 307/10.7; 361/90, 92
See application file for complete search history.

(56) References Cited

U.S. PATENT DOCUMENTS

| | | | |
|---|---|---|---|
| 4,587,939 A * | 5/1986 | Hemminger et al. | 123/479 |
| 6,046,512 A | 4/2000 | Heise | |
| 6,531,837 B1 * | 3/2003 | Forstl et al. | 318/139 |
| 7,078,829 B2 * | 7/2006 | Hunninghaus et al. | 307/10.1 |
| 7,485,983 B2 * | 2/2009 | Asao et al. | 307/10.1 |

FOREIGN PATENT DOCUMENTS

| | | |
|---|---|---|
| DE | 196 02 171 A1 | 7/1997 |
| DE | 19602171 A1 | 7/1997 |

* cited by examiner

*Primary Examiner* — Hal I Kaplan
(74) *Attorney, Agent, or Firm* — Laurence A. Greenberg; Werner H. Stemer; Ralph E. Locher

(57) ABSTRACT

A terminal state of a terminal 15 of a vehicle is enabled to be maintained for a minimum period of time even after a drop in the voltage supply. At the same time other loads are to have no effect on the holding time. A control device for controls access to a vehicle and has a voltage source, a voltage supply terminal to which a supply voltage can be applied, and a holding circuit to which the voltage source and the voltage supply terminal are connected in a common circuit point for the purpose of holding an On state for as long as the voltage at the voltage source does not fall below a predetermined value. A switching element that is connected into the circuit between the voltage supply terminal and the common circuit point serves to separate the common circuit point from the supply voltage. The holding time is thus decoupled from the VCC currents drawn by other loads.

12 Claims, 1 Drawing Sheet

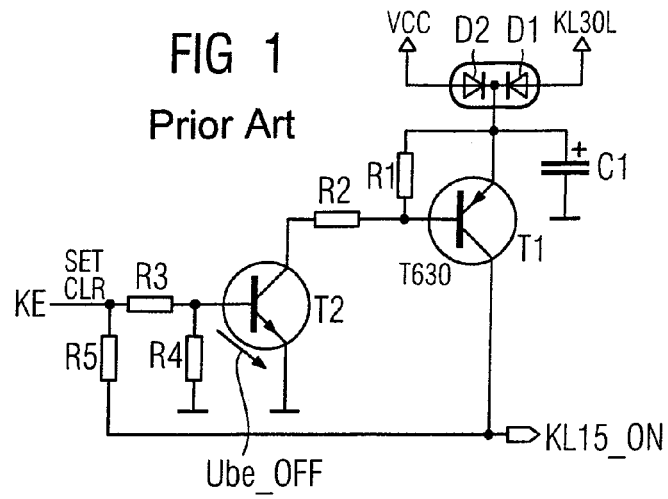
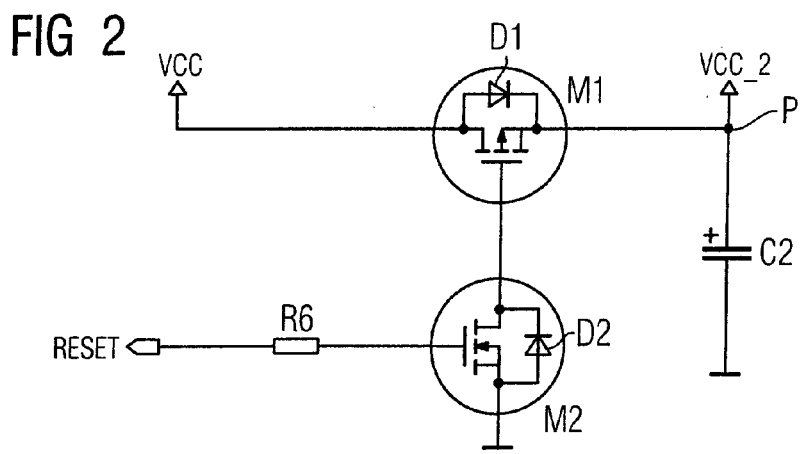
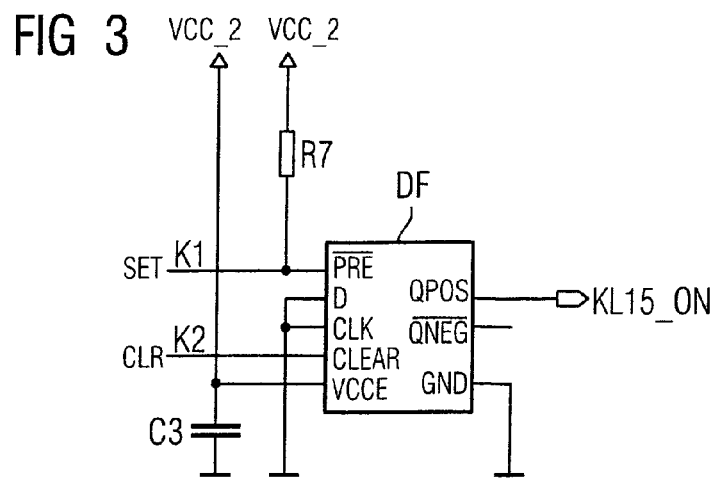

CONTROL DEVICE WITH TERMINAL 15—HOLDING CIRCUIT

CROSS-REFERENCE TO RELATED APPLICATION

This application claims the priority, under 35 U.S.C. §119, of German application DE 10 2006 046 032.4, filed Sep. 28, 2006; the prior application is herewith incorporated by reference in its entirety.

BACKGROUND OF THE INVENTION

Field of Invention

The present invention relates to a control device for controlling access to a vehicle based on a state of a terminal 15 of a vehicle electronics system. The control device contains a voltage source, at least one voltage supply terminal to which a supply voltage can be applied and a holding circuit to which the voltage source and the at least one voltage supply terminal are connected in a common circuit point for the purpose of holding an On state for as long as the voltage source does not fall below a predetermined value.

In certain situations it is necessary for the hardware terminal state KL15 (ignition) to be maintained for a certain time even if the battery voltage dips. For example, the engine of the vehicle is not to be switched off if a battery voltage drop occurs temporarily.

In control devices in the vehicle, a dipping of the battery voltage below 5.5 V is interpreted for example as a battery voltage drop. After the voltage drop has been detected, the aim is that it shall be possible for the hardware terminal state KL15 to be maintained for a minimum holding time th_min. At the battery voltage Ub<5.5 V, the control device and the microcontroller are in a hardware RESET state. A RESET also takes place at a voltage supply in the range of VCC=0 . . . VCC_min (minimum voltage supply).

FIG. 1 shows a circuit diagram of a holding circuit of a control device of the aforesaid kind, the holding circuit being implemented by discrete components. The current supplied to terminal KL15_ON is drawn from the capacitor C1. The latter is connected via a diode D1 to a terminal KL30L (corresponds to battery voltage source, e.g. 0 . . . 28 V). Via this path the capacitor C1 can be fed with battery voltage Ub. In parallel herewith the capacitor C1 is connected via a diode D2 to a terminal VCC (voltage source for microcontroller electronics, logic and auxiliary electronics). Via the terminal VCC the capacitor C1 is supplied with logic supply voltage of 5 V. The capacitor C1 thus has a redundant voltage supply.

The current from the capacitor C1 to the terminal KL15_ON is controlled via a PNP transistor T1. For this purpose the capacitor C1 or the cathodes of the diodes D1 and D2 is/are connected to an emitter of the transistor T1 and a terminal KL15_ON is connected to a collector of the PNP transistor T1.

The holding circuit can be controlled by an external SET or CLR command. Toward that end a base of the transistor T1 is connected to the emitter of the transistor T1 via a resistor R1. In addition, the base of the transistor T1 is connected to the collector of an NPN transistor T2 via a resistor R2. The emitter of the NPN transistor T2 is connected to ground. A voltage divider R3, R4 divides down the voltage of an input terminal KE for the base of the transistor. SET and CLR commands in the form of pulses can be applied to the terminal KE by a microcontroller. For the purpose of transferring the potential the terminal KL15_ON is also connected to the input terminal KE via a resistor R5.

In order to hold the terminal state KL15_ON, a SET command in the form of a positive pulse is applied to an input terminal KE with the result that the potential there increases temporarily (high level). The transistor T2 thereupon conducts and consequently so too does the transistor T1. The terminal KL15_ON is raised to the high potential of the capacitor C1, causing the transistor T2 to continue to conduct. The feedback via R5 produces the self-holding of the circuit. The drawn current flows from the capacitor C1 through the transistor T1 to the terminal KL15_ON.

The transistor T2 and hence also the transistor T1 can be turned off by a CLR command (clear) which is implemented by a brief pulse to ground (low level). This causes the current flow from the buffer capacitor C1 to be broken off.

The following applies to a battery voltage drop. If the self-holding is not actively terminated by a CLR command, the voltage at the buffer capacitor C1 and consequently also the base-collector voltage Ube of the transistor T2 fall below a predetermined level, with the result that the transistor T2 and also the transistor T1 turn off (non-conducting).

The supply voltage VCC is 5 V in normal operation. However, if it falls below 4.8 V and the battery voltage Ub at the terminal KL30L is less than 5.5 V, a RESET of the control device takes place.

A disadvantage with the circuit shown in FIG. 1 is that other loads connected to the VCC network have a direct influence on the holding time th_min, for this is dependent on the current drawn from the buffer capacitor C1. A further disadvantage is that the dielectric strength of the buffer capacitor C1 must also be dimensioned for the vehicle electrical system.

BRIEF SUMMARY OF THE INVENTION

It is accordingly an object of the invention to provide a control device with terminal 15—holding circuit that overcomes the above-mentioned disadvantages of the prior art devices of this general type, whose minimum holding time is independent of other loads and the state of the battery voltage.

The object is achieved according to the invention by a control device for controlling access to a vehicle based on a state of the terminal 15 of a vehicle electronics system. The control device has a voltage source, at least one voltage supply terminal to which a supply voltage can be applied, and a holding circuit to which the voltage source and the at least one voltage supply terminal are connected in a common circuit point for the purpose of holding an On State of the terminal 15 for as long as the voltage at the voltage source does not fall below a predetermined value. A switching element is inserted in a circuit between the voltage supply terminal and the common circuit point so that the common circuit point can be separated from the supply voltage.

This advantageously achieves an independence of the minimum holding time from the VCC network. The holding circuit is also independent of the battery voltage, since the voltage supply of the control device is provided by the VCC network during normal operation.

The voltage source is preferably a buffer capacitor that is fed from the VCC network.

A particular advantage is also that the buffer capacitor can be dimensioned for a nominal voltage between 4 V and 6 V, in particular for 5 V, if the supply voltage of the control device corresponds to just this nominal voltage. This results in cost benefits, since capacitors for 35 V vehicle electrical systems are considerably more expensive.

The voltage source VCC and VCC_2 can, however, also be provided by a storage battery or other appropriate devices, although these are usually more expensive than simple buffer capacitors.

The switching element which is connected into the circuit between the voltage supply terminal and the common circuit point of the control device according to the invention can be a MOSFET which is controlled by an externally provided RESET signal. The RESET signal thus provides a clearly defined time as of which the holding time of the holding circuit runs (trigger signal).

The holding circuit in the control device according to the invention can be implemented for example by a D flip-flop. A D flip-flop of this kind is available as a standard component.

Alternatively the holding circuit can also be built using discrete components exclusively, e.g. two bipolar transistors and a plurality of resistors. A circuit of this kind can be individually configured.

Other features which are considered as characteristic for the invention are set forth in the appended claims.

Although the invention is illustrated and described herein as embodied in a control device with terminal 15—holding circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 1 is a circuit diagram of a flip-flop holding circuit for a terminal KL15 according to the prior art;

FIG. 2 is a circuit diagram for providing a special supply voltage according to the invention; and FIG. 3 is a circuit diagram of a D flip-flop for holding the state of the terminal KL15 with the supply voltage provided according to FIG. 2.

DETAILED DESCRIPTION OF THE INVENTION

Referring now to the figures of the drawing in detail and first, particularly, to FIG. 1 thereof, there is shown a hardware terminal state KL15_ON (ignition) that is maintained for a minimum holding time th_min, with a controlling microcontroller not necessarily having to be active, as indicated by a level RESET=Low. This state is assumed for example if the voltage supply VCC drops below a predefined threshold value.

According to the invention a new supply voltage VCC_2 is generated for this purpose in a control device for controlling access to a vehicle according to the circuit diagram shown in FIG. 2. The supply voltage VCC_2 corresponds to the voltage at the buffer capacitor C2 for the holding circuit.

The buffer capacitor C2, and consequently also a common circuit point P at which the supply voltage VCC_2 is tapped, is connected to the terminal VCC via the drain-source section by use of a p-channel MOSFET M1. A diode D1 whose anode is directed to the terminal VCC runs parallel to drain and source. A gate of the MOSFET M1 is connected to ground via a drain-source section of an n-channel MOSFET M2. A diode D2 with its anode directed to ground is in turn disposed in parallel with the drain-source section. A gate of the MOSFET M2 is coupled to a RESET terminal via a resistor R6.

Thus, a new supply voltage VCC_2 for a KL15 flip-flop which is shown in FIG. 3 is generated from the supply voltage VCC for logic and microcontroller, which supply voltage VCC is typically 5 V.

A terminal 15 signal KL15_ON is generated according to the example of FIG. 3 by a D flip-flop DF. The D flip-flop DF has a first supply input GND which is connected to ground. A second supply input VCCE is connected to the new voltage supply terminal VCC_2 and protected against ground by a capacitor C3. The input PRE of the D flip-flop DF is also connected to the new supply voltage terminal VCC_2 via a resistor R7. In addition the input PRE is also connected to a terminal K1 by which a SET command can be input.

The two inputs D and CLK of the D flip-flop are connected to ground. The input CLEAR of the D flip-flop is connected to a terminal K2 via which a CLEAR command, i.e. a low level, can be input. A positive output QPOS of the D flip-flop is connected to the terminal KL15_ON. By this circuit the output terminal KL15_ON is set to 1 (high level) when the command SET is present (SET=1). Conversely, the output terminal KL15_ON is pulled to the low level 0 when the CLR command is sent to the input CLEAR of the D flip-flop by a pulse to ground.

In the normal operating state, when sufficient voltage is present and the ignition is switched on, the terminal state is KL15_ON=1 (i.e. at high level). The input levels of the terminals K1 and K2 are also high, i.e. SET=CLR=1. The RESET terminal of the circuit of FIG. 2 is then likewise at high level, i.e. RESET=1. In this case the new voltage is VCC_2~VCC-0.1V.

If the voltage drops below a critical value, a voltage monitoring circuit supplies the signal RESET=0. In this case the terminal state KL15_ON=1 must be maintained for a minimum holding time th_min. This state can be maintained for a certain period of time by the charge state of the buffer capacitor C2, since the buffer capacitor C2 provides the necessary energy for the D flip-flop DF and the signal KL15_ON.

The holding circuit is therefore activated according to FIG. 2 by a command RESET=0. The activation signal simultaneously serves as a trigger signal, for it is used to define a definite time as of which the state of the terminal 15 is held.

The holding circuit is decoupled from the VCC terminal by the MOSFET M1. This is important in particular during the transition from a normal mode of operation, in which the supply voltage is sufficiently high and no RESET command is present (RESET=1), to a RESET state (RESET=0) as well as in the RESET state itself (RESET=0). This is because the holding time is then not dependent on other loads which are connected to the VCC supply voltage. Only the holding circuit itself is connected to the capacitor C2. As a result, given a smaller capacitance of the buffer capacitor C2, an identical holding time th_min can be achieved as in prior art solutions. The effect of the VCC current drawn by other loads thus has no impact on the holding time and more particularly on the voltage VCC_2.

Because the capacitor C2 is not connected to the battery voltage Ub, the holding time is not dependent on the state of the battery voltage Ub. This provides the further advantage that the buffer capacitor C2 must be dimensioned only for the nominal voltage, e.g. VCC=5 V, but not for a higher vehicle electrical system voltage, e.g. $U_b$=35 V. It is also not necessary for VCC>VCC_min and for an extremely small VCC drawn current to be flowing in order to guarantee the minimum holding time th_min, as is necessary with the circuit shown in FIG. 1.

The invention claimed is:

1. A control device for holding an on state at a terminal of a vehicle electronics system comprising:
   a voltage source;
   at least one voltage supply terminal to which a supply voltage can be applied;
   a holding circuit coupled to said voltage source at a common circuit point for holding the on state of the terminal for as long as a voltage at said voltage source does not fall below a predetermined value; and
   a switching element including a controllable path connected between said voltage supply terminal and said common circuit point so that said common circuit point is switchably separated from the supply voltage, said switching element including a control terminal for controlling said controllable path, said control terminal of said switching element not part of said controllable path.

2. The control device according to claim 1, wherein said voltage source is a buffer capacitor.

3. The control device according to claim 2, wherein said buffer capacitor is dimensioned for a nominal voltage between 4 V and 6 V.

4. The control device according to claim 1, wherein said holding circuit is a D flip-flop.

5. The control device according to claim 3, wherein the nominal voltage is 5 V.

6. The control device according to claim 1, wherein said terminal is an ignition terminal.

7. A control device for holding an on state at a terminal of a vehicle electronics system comprising:
   a voltage source;
   at least one voltage supply terminal to which a supply voltage can be applied;
   a holding circuit coupled to said voltage source at a common circuit point for holding the on state of the terminal for as long as a voltage at said voltage source does not fall below a predetermined value; and
   a switching element including a controllable path connected between said voltage supply terminal and said common circuit point so that said common circuit point is switchably separated from the supply voltage, said switching element including a control terminal for controlling said controllable path, said control terminal of said switching element not part of said controllable path;
   wherein said switching element is a MOSFET controlled by an externally provided RESET signal.

8. The control device according to claim 7, wherein said voltage source is a buffer capacitor.

9. The control device according to claim 8, wherein said buffer capacitor is dimensioned for a nominal voltage between 4 V and 6 V.

10. The control device according to claim 9, wherein the nominal voltage is 5 V.

11. The control device according to claim 7, wherein said holding circuit is a D flip-flop.

12. The control device according to claim 7, wherein said terminal is an ignition terminal.

* * * * *